United States Patent [19]
Sarma et al.

[11] Patent Number: 5,258,323
[45] Date of Patent: Nov. 2, 1993

[54] SINGLE CRYSTAL SILICON ON QUARTZ

[75] Inventors: Kalluri R. Sarma, Mesa; Charles S. Chanley, Scottsdale, both of Ariz.

[73] Assignee: Honeywell Inc., Minneapolis, Minn.

[21] Appl. No.: 998,968

[22] Filed: Dec. 29, 1992

[51] Int. Cl.5 .......................................... H01L 21/76
[52] U.S. Cl. ....................................... 437/63; 437/62; 437/225; 437/974; 437/21; 148/DIG. 12; 148/DIG. 135; 148/DIG. 150
[58] Field of Search ................ 437/62, 63, 21, 225, 437/974; 148/DIG. 12, DIG. 135, DIG. 150

[56] References Cited

U.S. PATENT DOCUMENTS

| | | | |
|---|---|---|---|
| 4,601,779 | 7/1986 | Abernathey et al. | 437/974 |
| 5,013,681 | 5/1991 | Codbey et al. | 437/62 |
| 5,032,544 | 7/1991 | Ito et al. | 148/DIG. 12 |
| 5,110,748 | 5/1992 | Sarma | 437/974 |
| 5,122,887 | 6/1992 | Mathewson | 359/53 |
| 5,152,857 | 10/1992 | Ito et al. | 148/DIG. 12 |

FOREIGN PATENT DOCUMENTS

| | | | |
|---|---|---|---|
| 0362838 | 4/1990 | European Pat. Off. | 148/DIG. 135 |
| 0069938 | 3/1990 | Japan | 437/974 |

OTHER PUBLICATIONS

J. P. Salerno, et al., "Single-Crystal Silicon Transmissive AMLCD", 1992, SID 92 Digest, pp. 63–66.
Yuji Hayashi, et al., "Fully Integrated Poly-Si CMOS LCD with Redundancy", 1991, Proceedings of the SID, vol. 32/4, pp. 297–300.

Primary Examiner—Brian E. Hearn
Assistant Examiner—Trung Dang
Attorney, Agent, or Firm—John G. Shudy, Jr.

[57] ABSTRACT

A method for fabricating single crystal islands on a high temperature substrate, thereby allowing for the use of high temperature processes to further make devices incorporating the islands such as, for example, high mobility thin film transistor integrated drivers for active matrix displays. The method essentially includes depositing an etch stop layer on a single crystal silicon substrate, depositing a single crystal silicon device layer on the etch stop layer, bonding a quartz substrate to the single crystal silicon device layer at room temperature, sealing and securing with an adhesive the edges of the single crystal silicon substrate, the etch stop layer, the single crystal silicon device layer and the quartz substrate, grinding away a portion of the silicon substrate and a portion of the adhesive, etching away the remaining portion of the silicon substrate, removing the remaining portion of the adhesive, etching away the etch stop layer, applying a photoresist mask on the single crystal silicon device layer for defining the islands on the single crystal silicon device layer, etching single crystal silicon islands, and then the first non-room-temperature process of diffusion bonding the single crystal silicon islands to the quartz substrate.

18 Claims, 4 Drawing Sheets

SINGLE CRYSTAL SILICON ON QUARTZ

BACKGROUND OF THE INVENTION

The present invention is relevant to high resolution active matrix display technology. Particularly, the invention pertains to the fabrication of single crystal silicon thin film transistors having high mobility, on a high temperature transparent substrate.

High resolution active matrix displays are desired for various applications including computers, entertainment, electronics and avionics. In the related art, the high resolution active matrix displays are manufactured using amorphous silicon (a-Si) active matrix thin film transistors (TFTs), having external row and column drivers connected to the display glass with a flex cable or other connecting mechanism. The external row and column drivers are fabricated using conventional single crystal silicon wafers, which is an approach that is satisfactory for only low resolution displays. The reason is that because, as the display resolution increases, the number of interconnections increases and the interconnect pitch decreases. Such increase of interconnection density results in an extremely difficult, impractical or impossible, interconnection of the external drivers to the display. For instance, when the interconnect pitch, which is the distance between the centers of the interconnects, becomes smaller than 0.006 inches (150 microns), then the feasibility of the implementation of external drivers diminishes. Light valve displays require higher resolutions such as one thousand lines per inch (lpi) or greater, with a 0.001 inch (25 micron) or smaller pitch, resulting in an almost impossible task to utilize interconnections to external drivers. The solution to this very small pitch interconnection problem, is fabrication of row and column drivers on the display glass itself, i.e., integrated drivers, together with the active matrix array. Integrated drivers allow high display resolution, reduce external connections from several thousand to less than several dozen, improve display system reliability and reduce costs. However, because of the low mobility (e.g., one centimeter squared per volt-second) of a-Si TFTs in the present displays, fabrication of integrated drivers on high resolution displays is not practical since the needed performance would not be present. In response to this situation, polysilicon (p-Si) TFTs are being developed in the related art for displays having integrated drivers. The mobility of p-Si TFTs is approximately 50 centimeters squared per volt-second. Even though p-Si TFTs have significantly better mobility than a-Si TFTs, they still require a complex series-parallel architectures for the driver design. The "off" current in polysilicon TFTs is high; thus, two TFTs are connected in series to reduce the "off" current.

Much more superior integrated drivers can be fabricated using single crystal silicon TFTs having a typical mobility of 600 centimeters squared per volt-second. If one is able to fabricate single crystal silicon TFTs on glass, having a performance comparable to bulk silicon devices, one can fabricate high resolution displays having integrated drivers without performance degrading tradeoffs.

In the related art, two approaches are being pursued to fabricate single crystal silicon TFTs on a transparent substrate. One approach involves fabricating the TFT drivers in a silicon-on-insulator (SOI) substrate, attaching the driver side of the SOI substrate to a transparent display substrate having an adhesive, and etching away a silicon wafer leaving behind the TFTs in the driver layer. Major problems with this approach are the poor reliability of the low temperature adhesive bonding and the degrading effect of the presence of this adhesive layer on the performance of high current drivers.

A second approach involves electrostatically bonding a silicon wafer having an etch-stop layer to an expansion-matched glass substrate, etching away the silicon wafer and the etch stop layer thereby leaving behind a thin single crystal silicon device layer, and fabricating TFTs on this device layer using lower processing temperatures (e.g., 600 degrees Centigrade) which are dictated by the strain point of glass. This approach requires further development in the use of low temperature device processes. The present invention overcomes the drawbacks of the two above-noted approaches for fabricating single crystal silicon TFTs on a transparent substrate.

SUMMARY OF THE INVENTION

The present invention uses a method which involves bonding a fused quartz substrate to a silicon wafer having an etch-stop layer, removing the silicon wafer and the etch-stop layer thereby leaving behind a thin single crystal silicon device layer, and fabricating single crystal silicon TFTs for active matrix and integrated drivers, using conventional high temperature device processes.

The features of the invention are the development of high mobility single crystal silicon TFTs on transparent display substrates, and the improvement of the resolution and reliability of active matrix displays. The advantages of using fused quartz as a substrate in the invention is that the quartz is readily available in needed sizes and required surface quality, and quartz has high chemical purity, high temperature tolerance and compatibility with conventional silicon integrated circuit processing techniques.

DESCRIPTION OF THE PREFERRED EMBODIMENTS

Figure 1:
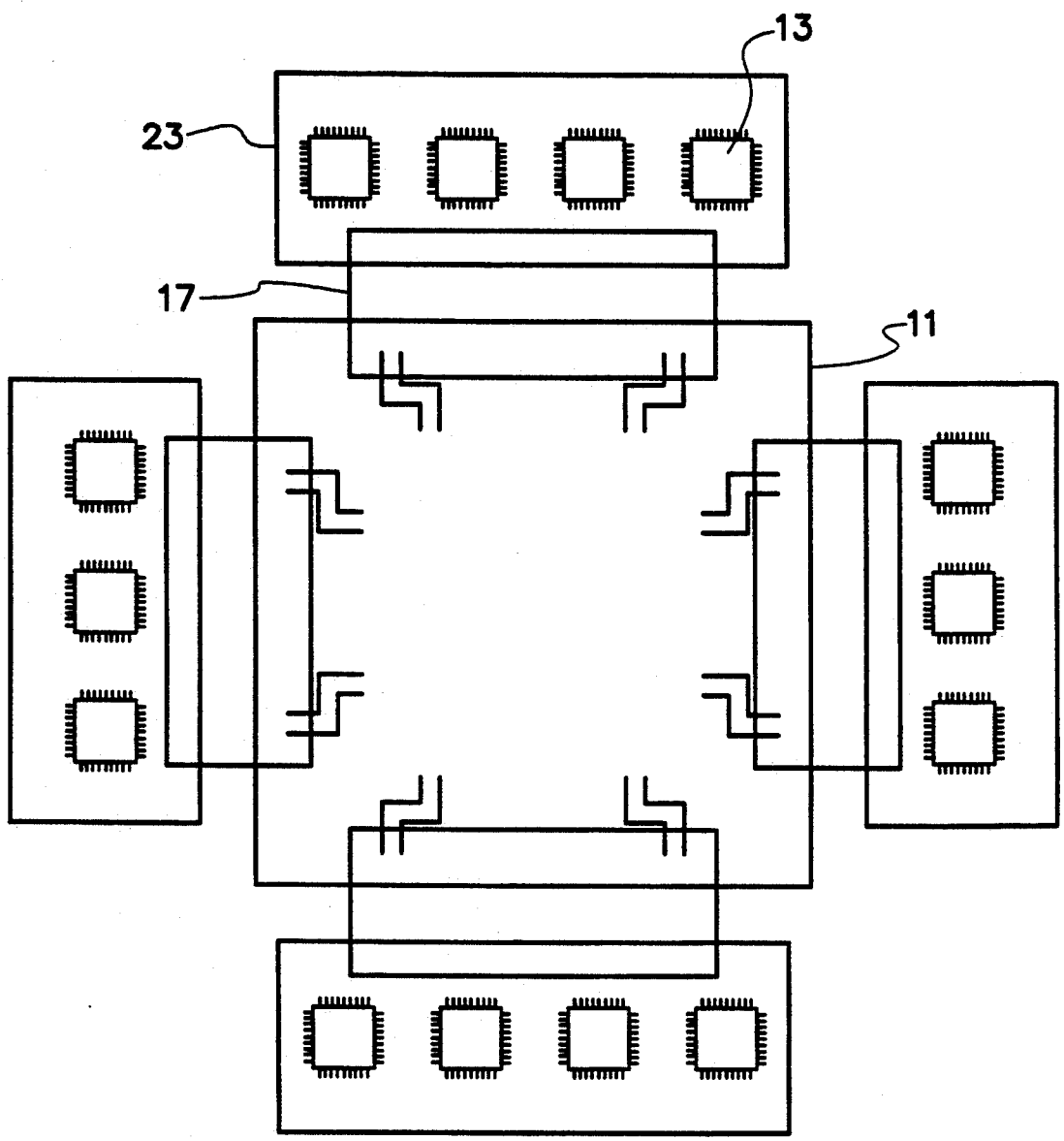
FIG. 1 shows a layout of the related art drivers and active matrix display.
Figure 2:
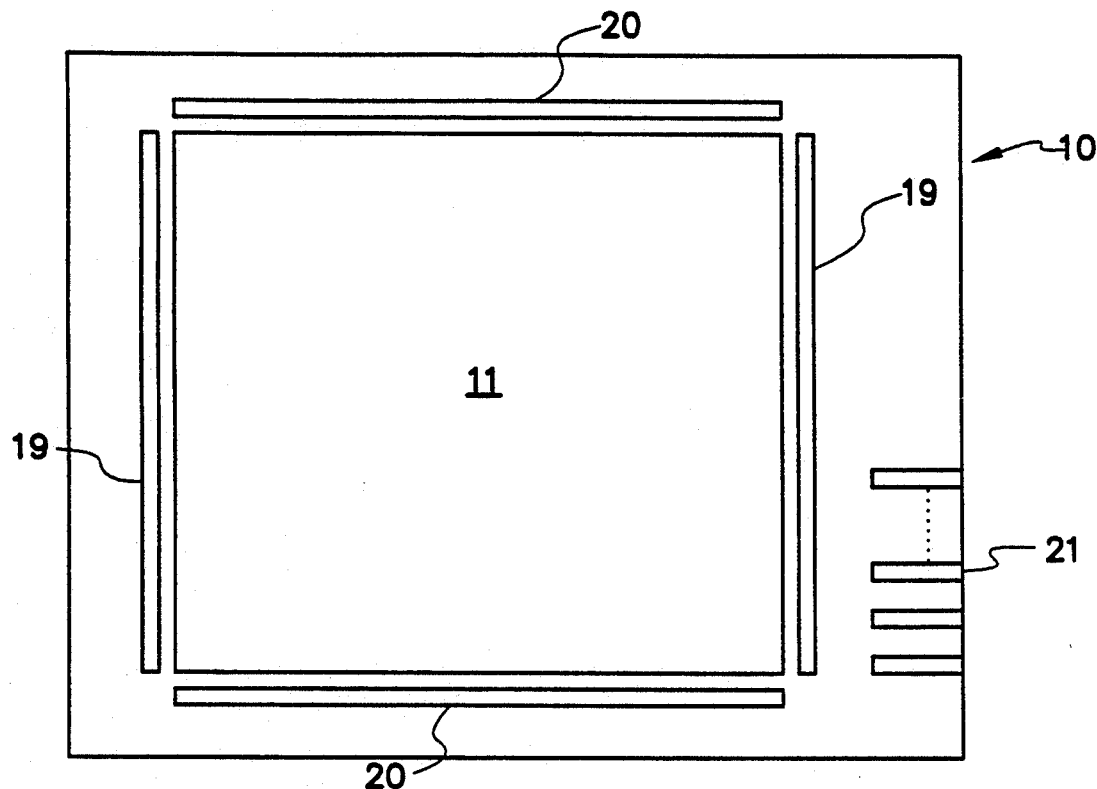
FIG. 2 shows the layout of a single crystal active matrix display and single crystal silicon integrated drivers on the same substrate.

The related art active matrix display array 11 in FIG. 1, has drivers 13 on printed circuit board 23 that are situated apart from array 11 and connected with flex connectors 17 to array 11. Several drawbacks of this configuration are limited display resolution and reliability. FIG. 2 illustrates display 10 of the present invention which is an active matrix array 11 having integrated row drivers 19, and column drivers 20, on the same display substrate. Few external interconnects 21 provide for driver connections.

Figure 3:
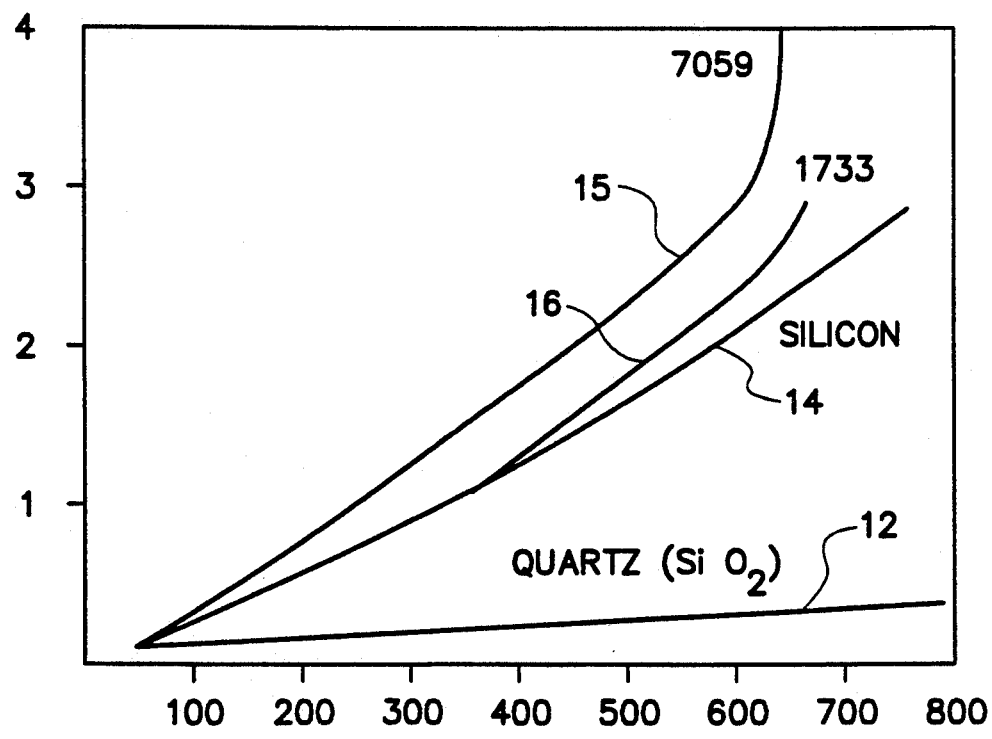
FIG. 3 is a graph revealing the thermal expansion coefficients of silicon, quartz and other kinds of glass.

While it may be apparent to use a high temperature transparent substrate such as quartz for conventional high temperature device processing, it has not been possible to bond a silicon wafer to a quartz ($SiO_2$) substrate because of the big difference between the expansion coefficients 12 and 14 of quartz and silicon, respectively, as shown in FIG. 3. Expansion coefficient 15 of CORNING 7059 glass appears very different than the other materials, especially at around 600 degrees Centigrade. Coefficient of expansion 16 of CORNING 1733 glass substrate is very close to coefficient 14 of silicon. Thus, a silicon wafer can be bonded to CORNING 1733 and processed, at low temperatures (e.g., 600 degrees Centigrade), without breakage. However, if silicon is bonded to quartz at a high temperature by diffusion or an anodical process, the resulting quartz-silicon composite would eventually crack or shatter and disintegrate into many pieces while cooling down to room temperature due to the thermal stresses exceeding the fracture strengths of quartz and silicon.

If a single crystal silicon substrate surface is prepared to be hydrophilic, it will bond to a quartz substrate, even at room temperature. However, the strength of this kind of bond is not sufficient to keep the silicon-quartz composite in one unit while performing grinding and lapping operations to remove a major portion of the silicon substrate before selective etching is done to remove the remaining final part of the silicon wafer and the etch-stop layer. The present invention prevents the destructive aspect of the latter operations.

Figure 4A:
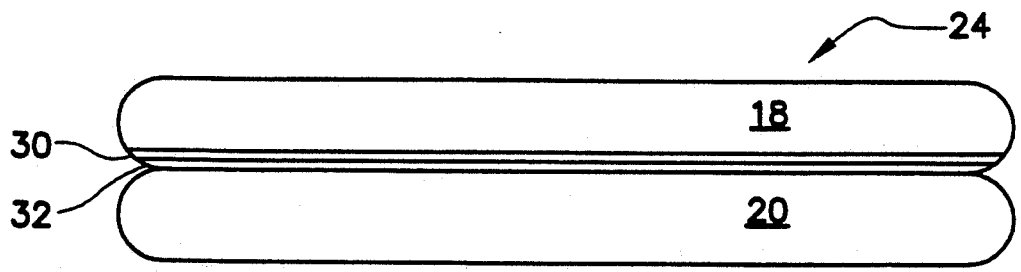
FIG. 4a–4g show a series of steps for fabricating single crystal TFTs on a quartz substrate.
Figure 4B:
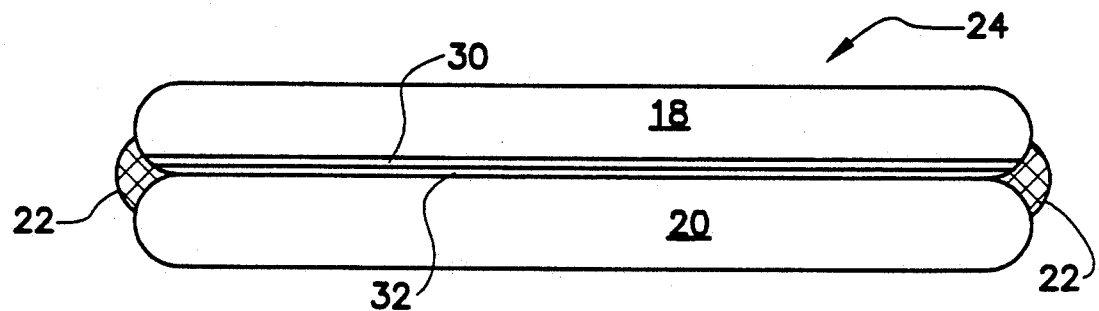
Figure 4C:
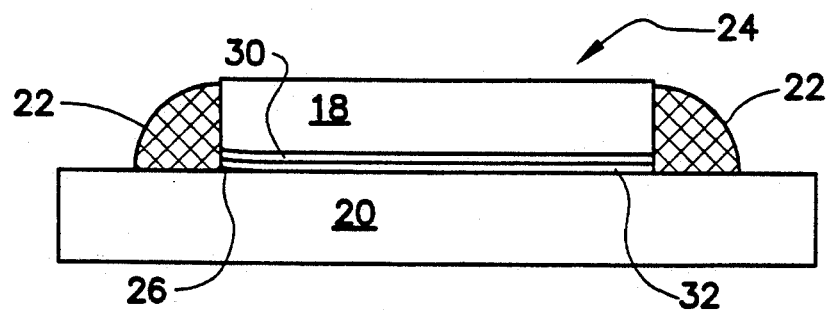
Figure 4D:
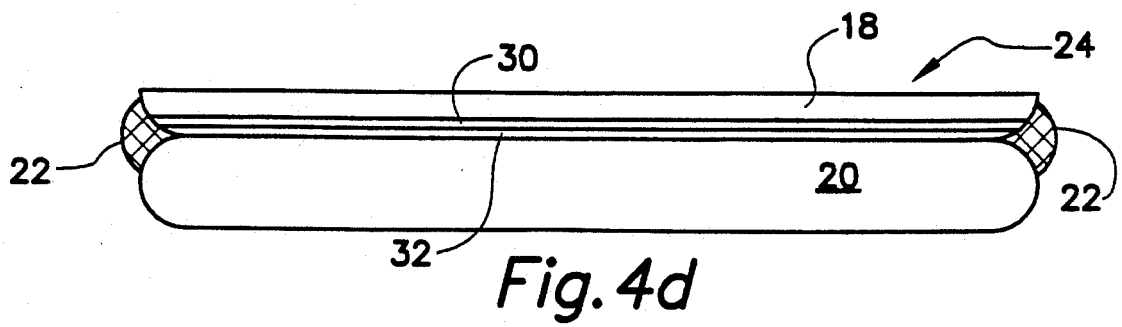

FIGS. 4a-g illustrate the various steps involving fabrication of single crystal TFTs on a quartz substrate 20. To begin, one epitaxially deposits a 2 micron thick heavily boron (P++) doped silicon layer 30, in FIG. 4a, as an etch stop layer on an approximately 22 mil lightly boron (P−) doped single crystal silicon substrate 18 at about 900 degrees Centigrade. Next, an approximately 0.6 micron thick lightly boron (P−) doped single crystal silicon device layer 32 is epitaxially deposited on silicon etch stop layer 30 at about 900 degrees Centigrade. Single crystal silicon device layer 32 has a surface with no more than a 0.3 micron variation in surface relative to a true plane at the surface. The surface of single crystal device layer 32 is cleaned in a solution containing $H_2O_2$. Then, one bonds a surface of an amorphous quartz substrate 20, the surface of quartz substrate 20 having no more than a 0.3 micron variation in surface relative to a true plane at the surface, to the cleaned surface of single crystal silicon device layer 32, wherein the surfaces of quartz substrate 20 and silicon device layer 32 naturally bond through hydrogen-oxygen (H—0) bonding at room temperature. FIG. 4b shows the securing and sealing the bond of single crystal silicon device layer 32 and quartz layer 20 with an adhesive 22 EPO-TEK 301 applied to edge of silicon substrate 18, etch stop layer 30, single crystal silicon device layer 32 and quartz layer 20. FIG. 4c illustrates an alternative configuration having layers 18, 30 and 32 different in size relative to layer 20 or cut down in size, and then adhesive 22 being applied to the layers for sealing and securing. FIG. 4d illustrates grinding away a portion of silicon substrate 18 and a portion of adhesive 22. The remaining portion of silicon substrate 18 is etched away with ethylenediamine pyrocatechol. The remaining portion of adhesive 22 is physically removed from the edges of layers 20, 30 and 32. Etch stop layer is etched away. Islands 34 are defined with a photoresist mask applied to single crystal silicon device layer 32. Then dry etching of single crystal silicon islands is performed with reactive ion etching of portions of single crystal device layer 32, according to a pattern of the photoresist mask. Single crystal silicon islands 34 are diffusion bonded to quartz substrate 20 at about 1000 degrees Centigrade; and, at the same time, single crystal silicon islands 34 may be thermally oxidized in ambient oxygen at about 1000 degrees Centigrade, to form a 500 angstrom layer 36 of silicon dioxide on silicon islands 34. After these processes, related art processing methods can be resorted to in order to complete the making of high mobility thin film transistors for integrated drivers.

As noted above, after conditioning the silicon layer 32 surface to be hydrophilic, the layer 32 surface is bonded to a quartz substrate 20 at room temperature. Cleaning silicon layer 32 in an RCA solution (RCA 1 - 1 $NH_3$: 5 $H_2O$:1 $H_2O_2$, or RCA 2 - 1 HCl:6 $H_2O$:1 $H_2O_2$) or solutions containing $H_2SO_4$ and $H_2O_2$ may be used to make the silicon surface hydrophilic. The bonding surfaces of silicon layer 32 and quartz 20 have a planar surface that does not exceed 0.3 micron in variation in planarity. After the silicon layer 32 and quartz wafer 20 surfaces are cleaned in a clean room to produce particle-free surfaces, a very uniform bonding can occur with no voids. After the bonding, this composite layer 24 is edge sealed with a suitable adhesive material 22 as shown in FIG. 4b. FIG. 4b illustrates the situation when both silicon and quartz substrates 18 and 20 are of the same size and edge ground. FIG. 4c illustrates the situation when substrates 18 and 20 are not of the same size and not edge ground. Configuration of FIG. 4b or the configuration of FIG. 4c may be used. Edge-seal/adhesive 22 serves two purposes. First, in addition to the bonding, edge seal/adhesive 22 keeps silicon-quartz substrate composite 24 intact during the subsequent silicon grinding and lapping operations, including grinding away some adhesive 22, which result in composite 24 in FIG. 4d. Second, seal 22 presents water and other chemical etching solutions during lapping and thinning operations, from seeping into the bond interface through any improperly bonded regions at the very edge of substrates 18 and 20. FIG. 4c illustrates a crevice 26 at the very edge of the interface due to improper bonding. If water or etching solutions get to the interface, delamination of composite layer 24 could result. An effective adhesive 22 used for edge-sealing is EPO-TEK 301 (Epoxy Technology Inc.). A thin bead of this epoxy may be applied at the edge of substrate composite 24 with a syringe. Other material such as a photo resist or other adhesive materials may also be used for edge-sealing.

Figure 4E:
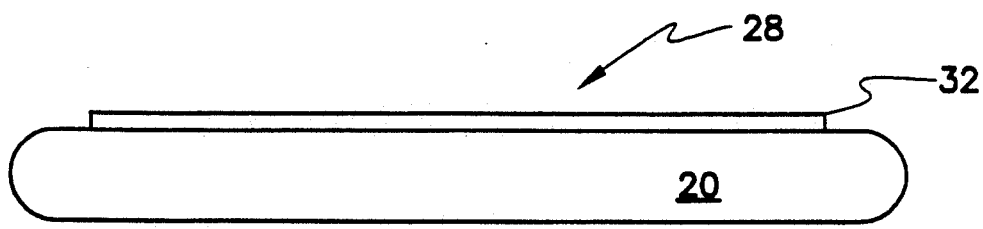
Figure 4F:
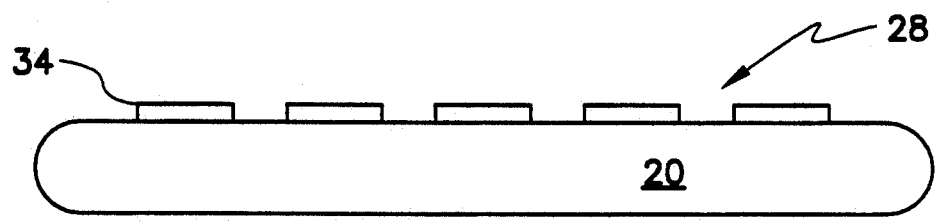

FIG. 4e shows composite 28 after edge-sealing removal, and silicon grinding and lapping operations. Remaining unground silicon substrate 18 is selectively etched away with the application of ethylenediamine pyrocatechol (EDP) selective etch. Then the epoxy edge seal is easily removed from quartz substrate 20 by a mechanical means. This removal is followed by removal of etch-stop layer 30 (having a typical thickness of two microns) by selective etching with 1 HF : 3 $HNO_3$: 8 HAc etchant, thereby leaving a thin (typically 0.6 micron thick) single crystal silicon device layer 32 as shown in FIG. 4e. FIG. 4f shows a result when the silicon device layer 32 is photolithographically patterned and dry etched (with reactive ion etching—RIE) to define silicon islands (mesas) 34 for the fabrication of integrated TFT active matrix display and row and column drive circuitry. All the steps of processing up through FIG. 4f are conducted at room temperature.

Figure 4G:
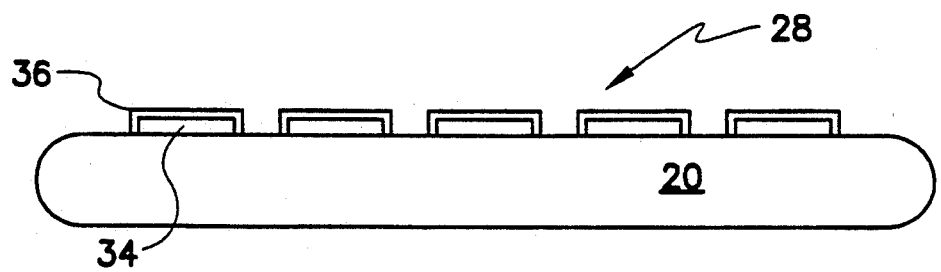

FIG. 4g reveals the result of the next process step which is the high temperature annealing/diffusion bonding of silicon islands 34 in ambient oxygen. Quartz wafer 20 having silicon islands 34 is placed in an annealing/oxidation furnace wherein the temperature is slowly ramped from room temperature to approximately 1,000 degrees Centigrade at a ramp rate of about 20 degrees Centigrade per minute. When the furnace has reached about 500 degrees Centigrade, dry oxygen is circulated into the furnace to grow about a 500 angstrom thickness of thermal silicon dioxide 36 on islands 34. This process occurs for about a total of sixty minutes, twenty-five minutes of it while the furnace temperature is being ramped from 500 to a 1,000 degrees and then the remaining thirty-five minutes is at about 1,000 degrees Centigrade. After that period of time, the substrate 20 is removed from the furnace. Even though the silicon on quartz structure 28 of FIG. 4g, is heated to be annealed at 1,000 degrees Centigrade, structure 20 does not have any thermal stress problems because the thermal stresses in silicon film islands 34 increase as a square of their size, i.e., diameter or width. Islands 34 having a size as large as 250 by 250 microns may be made without the destructive effect of stresses at very high temperatures such as 1000 degrees Centigrade. Thus, the etching of single crystal silicon device film 32 into islands 34 having a typical size on the order of 10 by 10 microns, results in very small thermal stresses in silicon film islands 34 at high temperatures.

Figure 5:
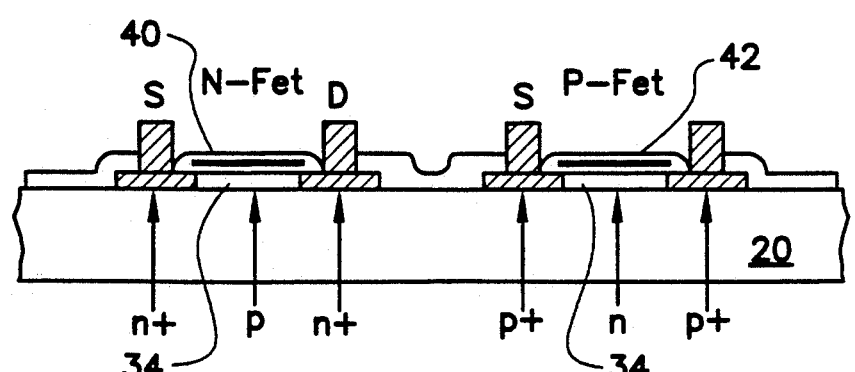
FIG. 5 is a cross-section view of a CMOS device fabricated with a silicon on quartz substrate.

The high temperature annealing process results in diffusion bonding with a substantial increase in bond strength between silicon islands 34 and quartz substrate 20. The process also results in a growing of a 500 angstrom thick thermal oxide 36 which is used as an implant screen oxide for subsequent CMOS device processing. Diffusion-bonded structure 28 may be processed using conventional, high-temperature silicon CMOS device processes. The conventional high temperature silicon CMOS processes may be used to fabricate either N or P channel single crystal silicon TFTs 40 or 42, respectively, as shown in FIG. 5, for an active matrix display with integrated drivers.

We claim:

1. A method for fabricating single crystal silicon islands on a quartz substrate, comprising:
   depositing an etch stop layer on a single crystal silicon substrate;
   depositing a single crystal silicon device layer on the etch stop layer;
   bonding a quartz substrate to the single crystal silicon device layer, at room temperature;
   sealing and securing with an adhesive the edges of the single crystal silicon substrate, the etch stop layer, the single crystal silicon device layer and the quartz substrate;
   grinding away a portion of the silicon substrate and a portion of the adhesive;
   etching away a remaining portion of the silicon substrate;
   removing a remaining portion of the adhesive;
   etching away the etch stop layer;
   applying a photoresist mask on the single crystal silicon device layer, for defining islands on the single crystal silicon device layer;
   etching the single crystal silicon islands; and
   diffusion bonding the single crystal silicon islands to the quartz substrate.

2. The method of claim 1 wherein said diffusion bonding the single crystal silicon islands to the quartz substrate, is at high temperature.

3. The method of claim 2 further comprising thermally oxidizing exposed surfaces of the single crystal silicon islands.

4. The method of claim 3 further comprising fabricating an active matrix pixel array and integrated row and column drivers on the single crystal silicon islands for a liquid crystal display.

5. The method of claim further comprising fabricating an active matrix pixel array and integrated row and column drivers on the single crystal silicon islands for an electroluminescent display.

6. The method of claim 3 further comprising fabricating an active matrix pixel array and integrated row and column drivers on the single crystal silicon islands for a dot matrix display.

7. A method for fabricating single crystal silicon islands on a high temperature substrate at room temperature, comprising:
   depositing an etch stop layer on a silicon substrate;
   depositing a single crystal silicon layer on the etch stop layer;
   bonding a high temperature substrate to the single crystal silicon layer;
   sealing and securing at the edges, the silicon substrate, the etch stop layer and the single crystal silicon layer to the high temperature substrate;
   grinding away a portion of the silicon substrate; etching away a remaining portion of the silicon substrate;
   removing the adhesive;
   etching away the etch stop layer;
   applying a mask on the single crystal silicon layer, for defining islands on the single crystal silicon layer; and
   etching the single crystal silicon islands.

8. The method of claim 7 further comprising fabricating an active matrix pixel array and integrated row and column drivers on the single crystal silicon islands for a liquid crystal display.

9. The method of claim 7 further comprising fabricating an active matrix pixel array and integrated row and column drivers on the single crystal silicon islands for an electroluminescent display.

10. The method of claim 7 further comprising fabricating an active matrix pixel array and integrated row and column drivers on the single crystal silicon islands for a dot matrix display.

11. A method for fabricating single crystal silicon islands on a high temperature substrate at room temperature, comprising:
   depositing a stop layer on a silicon substrate;
   depositing a single crystal silicon layer on the stop layer;
   bonding a high temperature substrate to the single crystal silicon layer;
   sealing and securing at the edges, the silicon substrate, the stop layer and the single crystal silicon layer to the high temperature substrate;
   removing the silicon substrate to the stop layer;
   removing the adhesive;
   removing the stop layer;
   applying a mask on the single crystal silicon layer for defining islands; and
   etching the single crystal silicon islands.

12. The method of claim 11 further comprising fabricating an active matrix pixel array and integrated row and column drivers on the single crystal silicon islands for a liquid crystal display.

13. The method of claim 11 further comprising fabricating an active matrix pixel array and integrated row and column drivers on the single crystal silicon islands for an electroluminescent display.

14. The method of claim 11 further comprising fabricating an active matrix pixel array and integrated row and column drivers on the single crystal silicon islands for a dot matrix display.

15. A method for fabricating islands of high mobility thin film transistors as integrated drivers on a substrate, comprising:

epitaxially depositing a 2 micron thick heavily boron (P++) doped silicon layer as an etch stop layer on an approximately 22 mil lightly boron (P−) doped single crystal silicon substrate at about 900 degrees Centigrade;

epitaxially depositing an approximately 0.6 micron thick lightly boron (P−) doped single crystal silicon device layer on the silicon etch stop layer at about 900 degrees Centigrade, the single crystal silicon device layer having a surface having no more than a 0.3 micron variation in surface relative to a true plane at the surface;

cleaning the surface of the single crystal device layer in a solution containing $H_2O_2$;

bonding a surface of an amorphous quartz substrate, the surface of the quartz substrate having no more than a 0.3 micron variation in surface relative to a true plane at the surface, to the cleaned surface of the single crystal silicon device layer, wherein the surfaces of the quartz substrate and silicon device layer naturally bond through hydrogen-oxygen (H—0) bonding at room temperature;

securing and sealing the bond of the single crystal silicon device layer and the quartz layer with an adhesive EPO-TEK 301 applied to edge of the silicon substrate, etch stop layer, single crystal silicon device layer and quartz layer;

grinding away a portion of the silicon substrate and a portion of the adhesive;

etching away a remaining portion of the silicon substrate with ethylenediamine pyrocatechol;

removing a remaining portion of the adhesive;

etching away the etch stop layer with an etchant;

defining islands with a photoresist mask applied to the single crystal silicon device layer;

dry etching of single crystal silicon islands, with reactive ion etching, portions of the single crystal device layer, according to a pattern of the photoresist mask;

diffusion bonding the single crystal silicon islands to the quartz substrate at about 1000 degrees Centigrade; and thermal oxidizing the single crystal silicon islands in ambient oxygen at about 1000 degrees Centigrade, to form a 500 angstrom layer of silicon dioxide on the silicon islands.

16. The method of claim 15 further comprising fabricating an active matrix pixel array and integrated row and column drivers on the single crystal silicon islands for a liquid crystal display.

17. The method of claim 15 further comprising fabricating an active matrix pixel array and integrated row and column drivers on the single crystal silicon islands for an electroluminescent display.

18. The method of claim 15 further comprising fabricating an active matrix pixel array and integrated row and column drivers on the single crystal silicon islands for a dot matrix display.

* * * * *